(12) United States Patent  
Tanaka et al.

(10) Patent No.: US 8,456,083 B2  
(45) Date of Patent: Jun. 4, 2013

(54) LIGHTING DEVICE

(75) Inventors: Koichiro Tanaka, Kanagawa (JP); Takatsugu Omata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/558,672

(22) Filed: Jul. 26, 2012

(65) Prior Publication Data

US 2013/0020932 A1    Jan. 24, 2013

Related U.S. Application Data

(62) Division of application No. 12/882,567, filed on Sep. 15, 2010, now Pat. No. 8,232,723.

(30) Foreign Application Priority Data

Sep. 17, 2009    (JP) ................................. 2009-215436

(51) Int. Cl.  
*H01J 1/62* (2006.01)

(52) U.S. Cl.  
USPC ............................ 313/506; 313/498; 313/509

(58) Field of Classification Search  
USPC ......................... 313/506, 498, 509  
See application file for complete search history.

(56) References Cited

U.S. PATENT DOCUMENTS

| | | |
|---|---|---|
| 7,697,052 B1 | 4/2010 | Yamazaki et al. |
| 2007/0284991 A1 | 12/2007 | Egi et al. |
| 2008/0042926 A1 | 2/2008 | Egi et al. |
| 2008/0129933 A1 | 6/2008 | Nishida et al. |
| 2008/0130122 A1 | 6/2008 | Egi et al. |
| 2008/0158682 A1 | 7/2008 | Egi et al. |
| 2008/0165315 A1 | 7/2008 | Nishida et al. |
| 2008/0176041 A1 | 7/2008 | Sato et al. |

FOREIGN PATENT DOCUMENTS

JP        2008-10245        1/2008

*Primary Examiner* — Anh Mai  
*Assistant Examiner* — Elmito Breval  
(74) *Attorney, Agent, or Firm* — Husch Blackwell LLP

(57) ABSTRACT

One object is to provide a lighting device having a large irradiation range at low cost. One object is to provide a lighting device with improved light extraction efficiency at low cost. The lighting device includes a light-transmitting base, a first light-transmitting electrode formed over almost the whole area of a surface of the light-transmitting base, an EL layer over the first light-transmitting electrode, and a second electrode over the EL layer. The light-transmitting base has a cylindrical shape, a conical shape, a prismatic shape, or a pyramidal shape whose bottom surface is the surface of the light-transmitting base.

10 Claims, 16 Drawing Sheets

FIG. 5A 0.7 mm  FIG. 5B 2 mm  FIG. 5C 10 mm
FIG. 5D 30 mm  FIG. 5E 50 mm  FIG. 5F 70 mm
FIG. 5G 80 mm  FIG. 5H 84 mm  FIG. 5I 90 mm
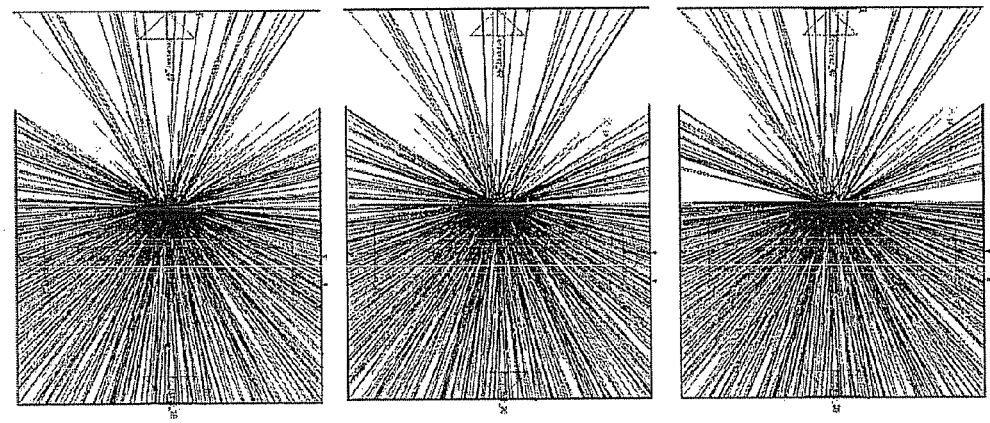
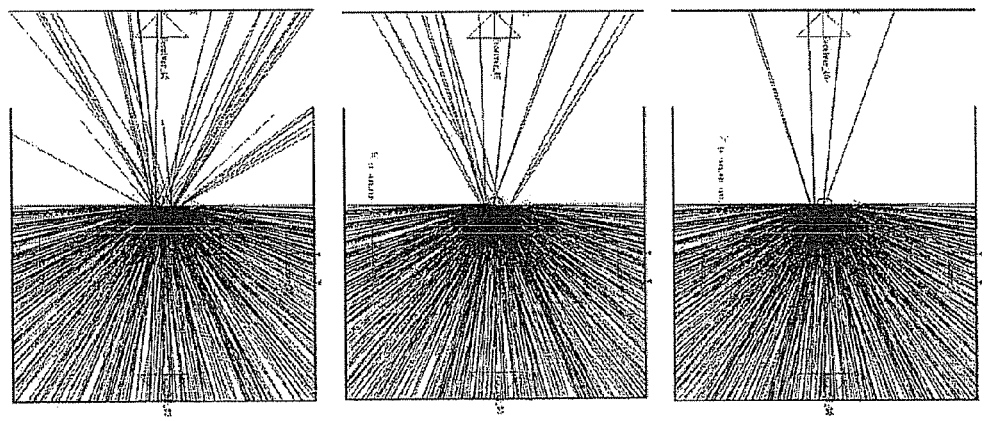
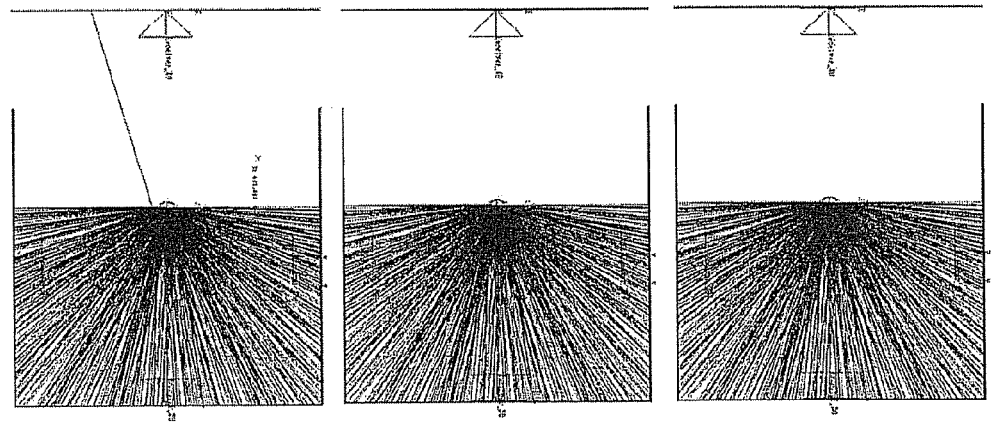

FIG. 6A  160 mm
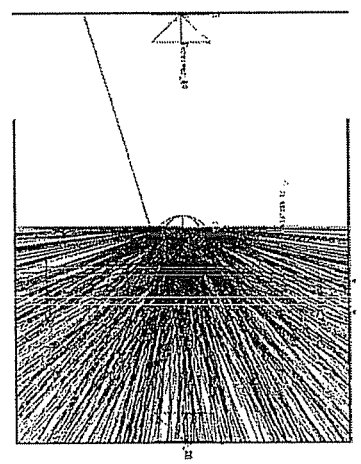
FIG. 6B  168 mm
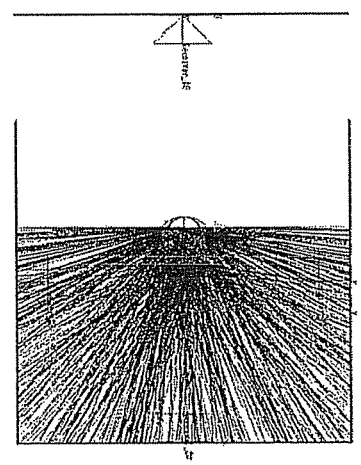
FIG. 6C  170 mm
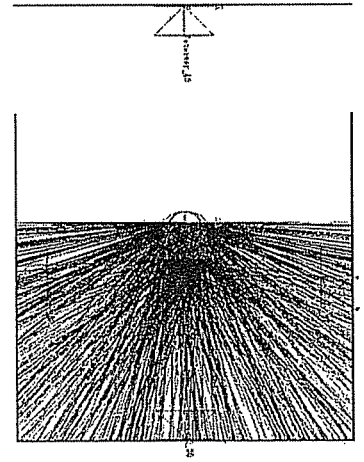

FIG. 7A  160 mm
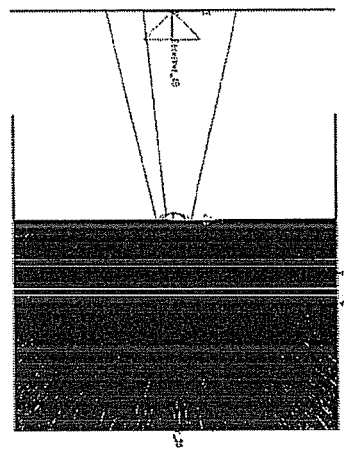
FIG. 7B  168 mm
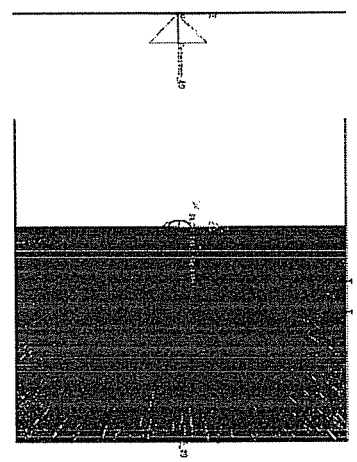
FIG. 7C  170 mm
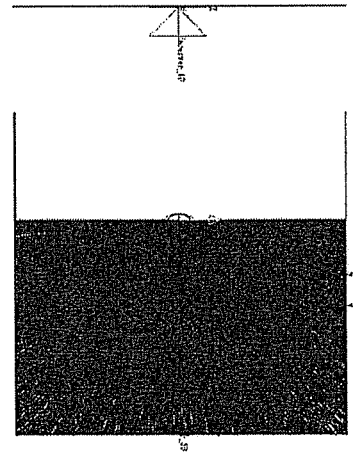

FIG. 8A  λ = 400 nm, h = 80 mm
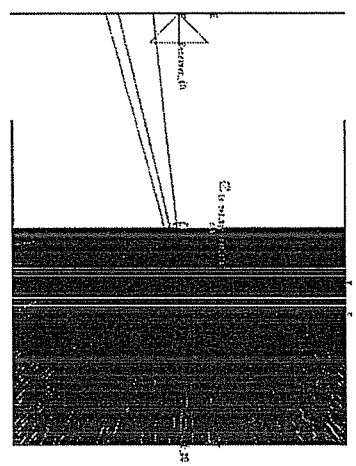
FIG. 8B  λ = 400 nm, h = 81 mm
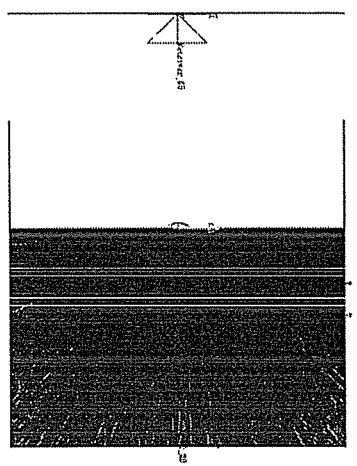
FIG. 8C  λ = 800 nm, h = 83 mm
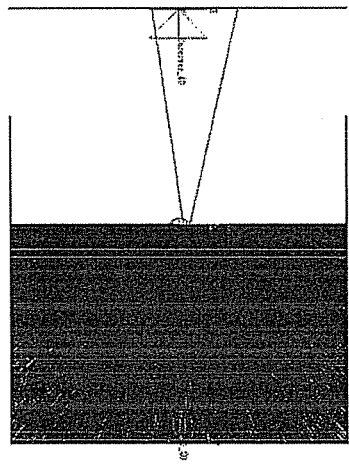
FIG. 8D  λ = 800 nm, h = 84 mm
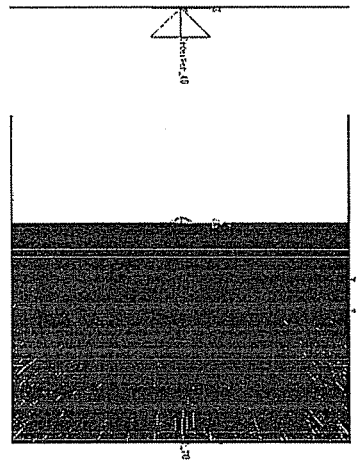

LIGHTING DEVICE

This application is a divisional of application Ser. No. 12/882,567 filed on Sep. 15, 2010 now U.S. Pat. No. 8,232,723.

BACKGROUND OF THE INVENTION

1. Field of the Invention

An embodiment of the invention relates to a lighting device. In particular, an embodiment of the invention relates to a lighting device utilizing electroluminescence.

2. Description of the Related Art

In recent years, research and development have been actively conducted on light-emitting elements utilizing electroluminescence. A basic structure of a light-emitting element utilizing electroluminescence is that in which a layer including a light-emitting substance is sandwiched between a pair of electrodes. By applying voltage between the electrodes of the light-emitting element, light from the light-emitting substance can be obtained.

A light-emitting element utilizing electroluminescence includes, in its category, a light-emitting element using a light-emitting substance of an organic compound and that using a light-emitting substance of an inorganic compound. In particular, application of the light-emitting element using a light-emitting substance of an organic compound to a planar light source is expected because the light-emitting element is easily enlarged due to its manufacturing method.

As examples of the applications of a planar light source, a display device, a backlight of a display device, a lighting device, and the like are given. Since light extraction efficiency (luminance) is emphasized in any of these applications, various techniques have been proposed so far to improve light extraction efficiency.

One of these techniques is a method in which a three-dimensional miniaturized structure is formed over a glass substrate and the total reflection component at a surface is reduced, so that light extraction efficiency is improved (for example, see Patent Document 1).

REFERENCE

Patent Document

[Patent Document 1]
Japanese Published Patent Application No. 2008-10245

SUMMARY OF THE INVENTION

It is certainly possible to improve light extraction efficiency from one surface of a substrate by using the above method. However, since production cost is inevitably increased by forming a miniaturized structure, the above method is unsuitable for an inexpensive lighting device.

In addition, since a large irradiation region of illumination light is needed for a lighting device, it is reasonable to improve extraction efficiency from all the surfaces (other than a surface for which a light-emitting element is formed) of a substrate as compared to improvement of extraction efficiency of only one surface of the substrate.

In view of the above problems, one object of an embodiment of the disclosed invention is to provide a lighting device having a large irradiation range at low cost. One object is to provide a lighting device with improved light extraction efficiency at low cost.

In an embodiment of the disclosed invention in this specification and the like, by using a light-transmitting base having a predetermined shape as a support of a light-emitting element, a large irradiation range and high extraction efficiency are obtained. Details thereof are described below.

An embodiment of the disclosed invention is a lighting device including a light-transmitting base, a first light-transmitting electrode formed over a surface (more preferably, almost the whole area of the surface) of the light-transmitting base, an electroluminescence (EL) layer over the first light-transmitting electrode, and a second electrode over the EL layer. The light-transmitting base has a cylindrical shape, a conical shape, a prismatic shape, or a pyramidal shape whose bottom surface is the surface of the light-transmitting base.

Another embodiment of the disclosed invention is a lighting device including a light-transmitting substrate, a first light-transmitting electrode formed over a surface (more preferably, almost the whole area of the surface) of the light-transmitting substrate, an EL layer over the first light-transmitting electrode, a second electrode over the EL layer, and a light-transmitting base attached to a surface opposite to the surface of the light-transmitting substrate. The light-transmitting base has a cylindrical shape, a conical shape, a prismatic shape, or a pyramidal shape whose bottom surface is the surface attached to the light-transmitting substrate.

In the above, it is preferable that the light-transmitting base have a prismatic shape with a bottom surface having m angles ($4 \leq m \leq \infty$), and the following formula as for relation of a height (h) of the light-transmitting base, a refractive index (n) of a material of the light-transmitting base, and a length (l) of a square circumscribing the bottom surface, be satisfied.

$$h \geq (-0.75 \cdot n + 1.98) \cdot l$$

Here, in the case where m is infinite, the light-transmitting base can have a cylindrical shape, and the length of one side of a square circumscribing the bottom surface is equal to the diameter of the bottom surface having a round shape. In addition, in the case where m is finite, there may be a plurality of squares circumscribing the bottom surface having m angles in some cases, and any of these squares can be a reference when the length of one side (l) is calculated.

In the above, another light-transmitting base having the same shape as the light-transmitting base can be formed over the second electrode.

Note that the EL layer can be formed with a layer of any material as long as the layer emits light due to its electric action and therefore, the structure and the material thereof do not need to be limited. For example, an organic EL layer formed mainly using an organic material or an inorganic EL layer formed mainly using an inorganic material may be used.

According to an embodiment of the disclosed invention, a lighting device with a large irradiation range can be obtained at low cost. In addition, a lighting device with sufficient extraction efficiency can be obtained at low cost.

BRIEF DESCRIPTION OF THE DRAWINGS

In the accompanying drawings:

FIGS. 5A to 5I each illustrate a state of light emission;
FIGS. 6A to 6C each illustrate a state of light emission;
FIGS. 7A to 7C each illustrate a state of light emission;
FIGS. 8A to 8D each illustrate a state of light emission;

DETAILED DESCRIPTION OF THE INVENTION

Figure 1A:
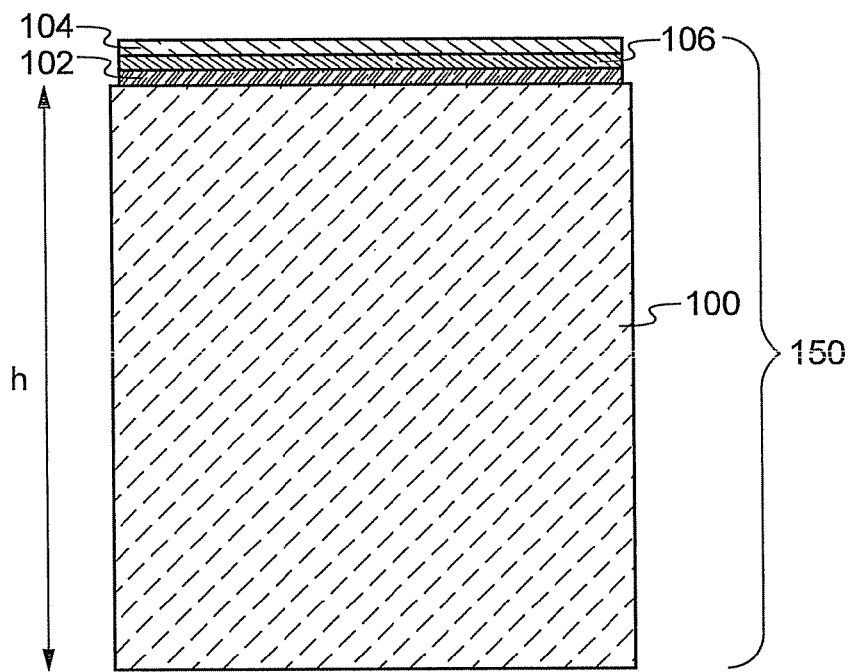
FIGS. 1A and 1B illustrate an example of a lighting device.

Hereinafter, Embodiments are described in detail using the drawings. However, the invention is not limited to the following description, and it will be easily understood by those skilled in the art that various changes and modifications can be made to the modes and their details without departing from the spirit of the invention. A structure of the different embodiment can be implemented by combination appropriately. On the description of the invention with reference to the drawings, a reference numeral indicating the same part is used in common throughout different drawings, and the repeated description is omitted.

Embodiment 1

In this embodiment, a lighting device which is an embodiment of the disclosed invention is described with reference to FIGS. 1A and 1B, FIGS. 2A and 2B, and FIGS. 3A to 3C.

Figure 1B:
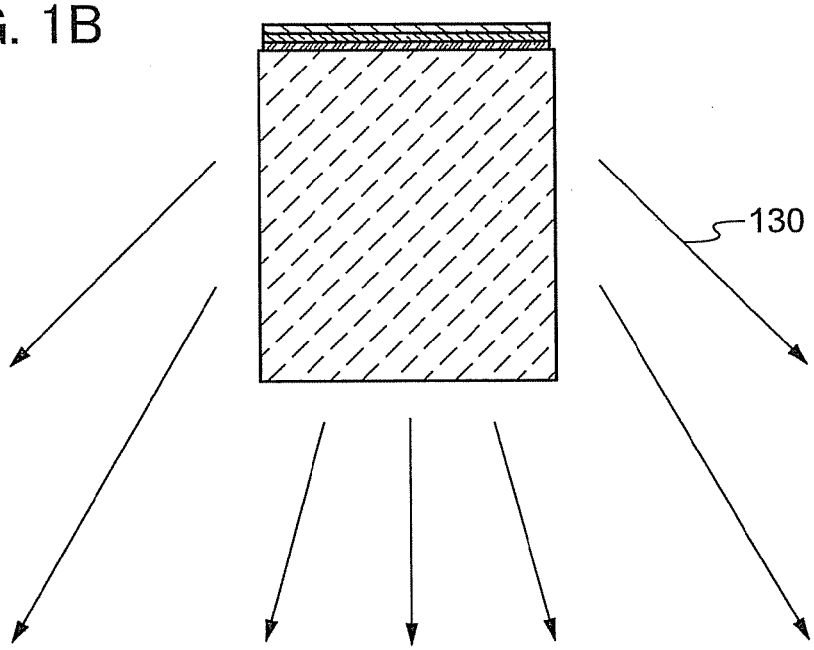
Figure 2A:
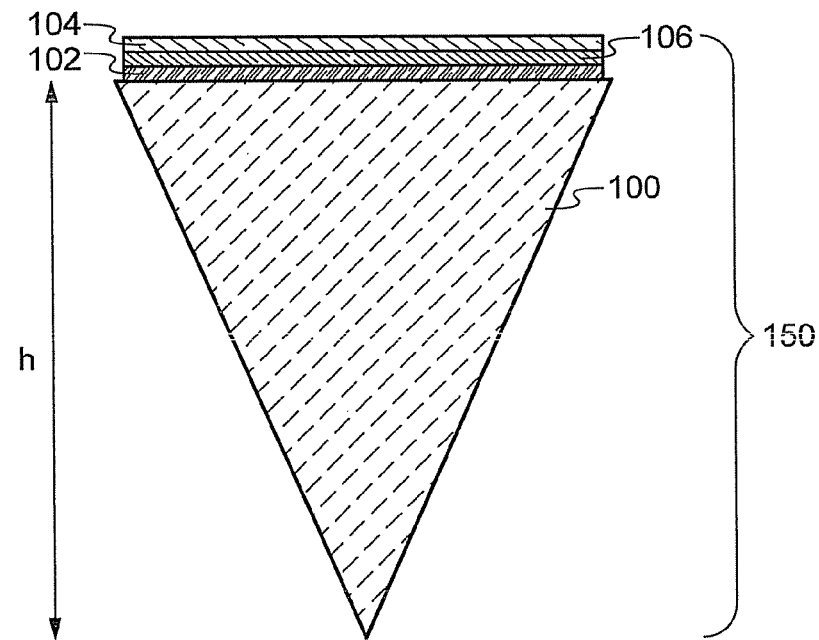
FIGS. 2A and 2B illustrate an example of a lighting device.
Figure 2B:
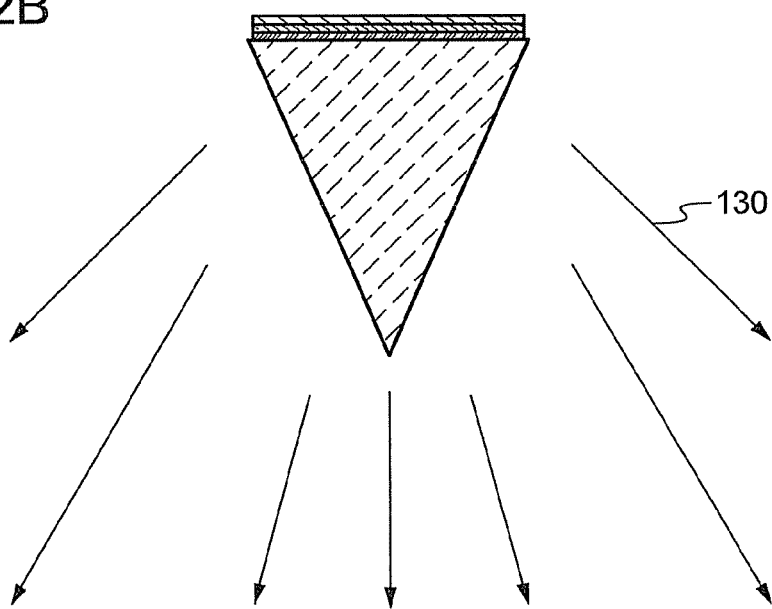

Examples of a lighting device are illustrated in FIGS. 1A and 1B and FIGS. 2A and 2B. FIG. 1A and FIG. 2A are cross sectional views each illustrating a structural example of a lighting device 150. FIG. 1B and FIG. 2B each schematically illustrate a state in which a wide area is irradiated with light beams 130 from the lighting device 150.

The lighting device 150 illustrated in FIG. 1A or FIG. 2A includes a light-transmitting base 100, a first electrode 102 and a second electrode 104 over the light-transmitting base 100, and an EL layer 106 between the first electrode 102 and the second electrode 104. In the above, a stacked structure of the first electrode 102, the EL layer 106, and the second electrode 104 can be referred to as a light-emitting element. Since light is extracted from the light-transmitting base 100 side in the lighting device 150, the first electrode 102 needs to have a light-transmitting property. Note that a sealing material, another substrate, or the like may be provided above the second electrode.

Here, it is preferable that the light-transmitting base have any of a cylindrical shape, a conical shape, a prismatic shape, or a pyramidal shape whose bottom surface is a surface for which the first electrode is formed. This is because when such a shape is employed, light can be extracted from the entire surfaces other than the surface for which the first electrode is formed, and therefore, light extraction efficiency can be improved. Note that FIGS. 1A and 1B illustrate the case where the light-transmitting base has a cylindrical shape or a prismatic shape, and FIGS. 2A and 2B illustrate the case where the light-transmitting base has a conical shape or a pyramidal shape.

Figure 3A:
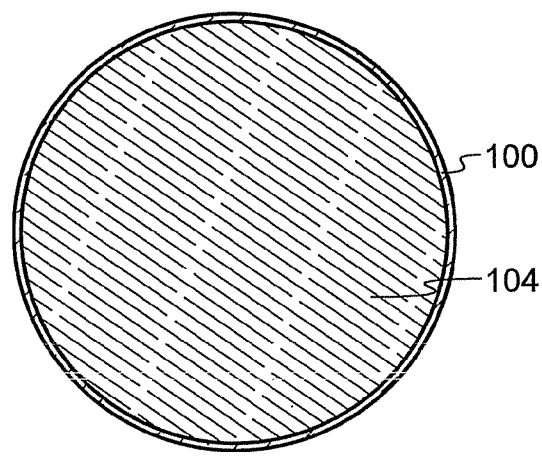
FIGS. 3A to 3C illustrates examples of a lighting device.
Figure 3B:
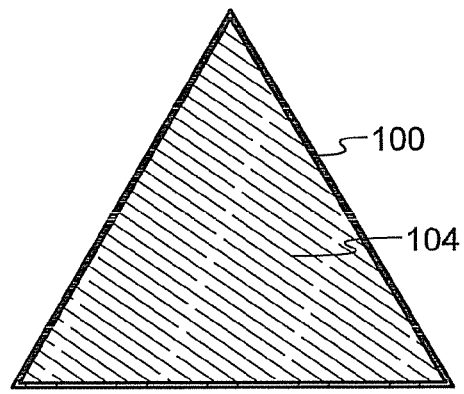
Figure 3C:
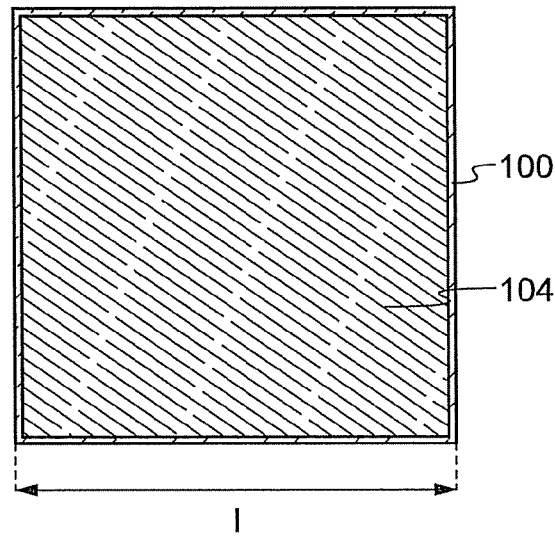

FIGS. 3A to 3C are plan views each illustrating the lighting device 150 of FIGS. 1A and 1B or FIGS. 2A and 2B seen from the light-emitting element side. FIG. 3A illustrates the light-transmitting base having a cylindrical shape or a conical shape. FIG. 3B illustrates the light-transmitting base having a triangular pole shape or a triangular pyramidal shape. FIG. 3C illustrates the light-transmitting base having a square pole shape or a square pyramidal shape. Note that the examples in which the light-emitting element is formed over almost the entire bottom surface of the light-transmitting base are described here; however, this embodiment of the disclosed invention is not limited thereto. The light-emitting element can be formed over only part of the bottom surface of the light-transmitting base. In this case, the planar shape of the light-emitting element may be similar to the bottom surface of the light-transmitting base, or may be set irrespectively of the shape of the bottom surface of the light-transmitting base.

Note that "light-transmitting" in this specification means having a transmittance of 60% or more with respect to light which has a wavelength having a peak within a wavelength range of 400 nm to 800 nm in an emission spectrum of the EL layer. Further, "base" means a support of the light-emitting element or a structure including the light-emitting element. The "base" also means a support whose bottom surface area (the area of one bottom surface in the case of having a plurality of bottom surfaces) accounts for less than 40% of the total area of the entire surfaces of the support. In addition, "bottom surface" of the base means a surface for which the first electrode (the light-emitting element) is formed or a surface approximately parallel to the surface for which the first electrode (the light-emitting element) is formed.

Note that although the example in which the light-emitting element is formed on the base directly is described in this embodiment, the light-emitting element may be formed over a light-transmitting substrate and then the light-transmitting substrate may be attached to the light-transmitting base. Here, "substrate" means a support which is a rectangular solid in which the sum of areas of one pair of surfaces facing each other accounts for 80% or more of the total area of the entire surfaces. In other words, "substrate" refers to a support which is a rectangular solid in which the area of the surface for which the first electrode (the light-emitting element) is formed accounts for 40% or more of the total area of the entire surfaces. Note that in the case where a refractive index differs between the substrate and the base, a loss of light due to reflection at an interface between the substrate and the base becomes a problem. Therefore, it is preferable that a material of the substrate and a material of the base have approximately the same refractive index. The same applies to a material with which the substrate and the base are attached to each other. It is preferable that the material with which the substrate and the base are attached to each other have approximately the same refractive index as those of the substrate and the base.

As described in this embodiment, in the case where a light-transmitting base is used as a support of the light-emitting element, a sufficient irradiation range can be secured without a miniaturized structure which causes increase in cost. Therefore, a lighting device with excellent characteristics can be manufactured at low cost, as compared to the case where a miniaturized structure is formed.

Note that although the base has any of a cylindrical shape, a conical shape, a prismatic shape, or a pyramidal shape in the above, the base may have a truncated conical shape, a truncated pyramidal shape, or a semispherical shape when processing steps of the base are not complicated. Further, corners of the base may be chamfered. That is, the base does not necessarily have an accurate cylindrical shape, an accurate conical shape, an accurate prismatic shape, an accurate pyramidal shape, or the like.

Embodiment 2

In this embodiment, the shape of the base for realizing a lighting device in which an irradiation range was secured and extraction efficiency was improved was obtained using computer simulation. Calculation results and a suitable shape of the base are described using FIG. 4, FIGS. 5A to 5I, FIGS. 6A to 6C, FIGS. 7A to 7C, FIGS. 8A to 8D, FIG. 9, FIG. 10, and FIGS. 11A to 11C.

Note that all the calculation below is performed using Light Tools ver. 6.3.0 manufactured by Optical Research Associates (ORA).

<Relation Between Size of Light-Emitting Surface and Height of Base>

First, in order to confirm relation between the size of a planar light source and the height (h) of the base, the state of light irradiation was confirmed at each of a plurality of different heights (h). Here, "height" of the base refers to a length of the base in a direction approximately perpendicular to the bottom surface of the base (see FIG. 1A and the like). Here, a square planar light source (Lambert light source) with an emission wavelength of 550 nm and a size of 100 mm×100 mm was typically used, and the light-transmitting base which had a square pole shape with a size of 100 mm×100 mm×h mm was used. In addition, BK7 manufactured by Schott Inc. was used as a material of the light-transmitting base. That is, as a calculation model, a lighting device similar to those in FIG. 1A and FIG. 3C was used.

Figure 4:
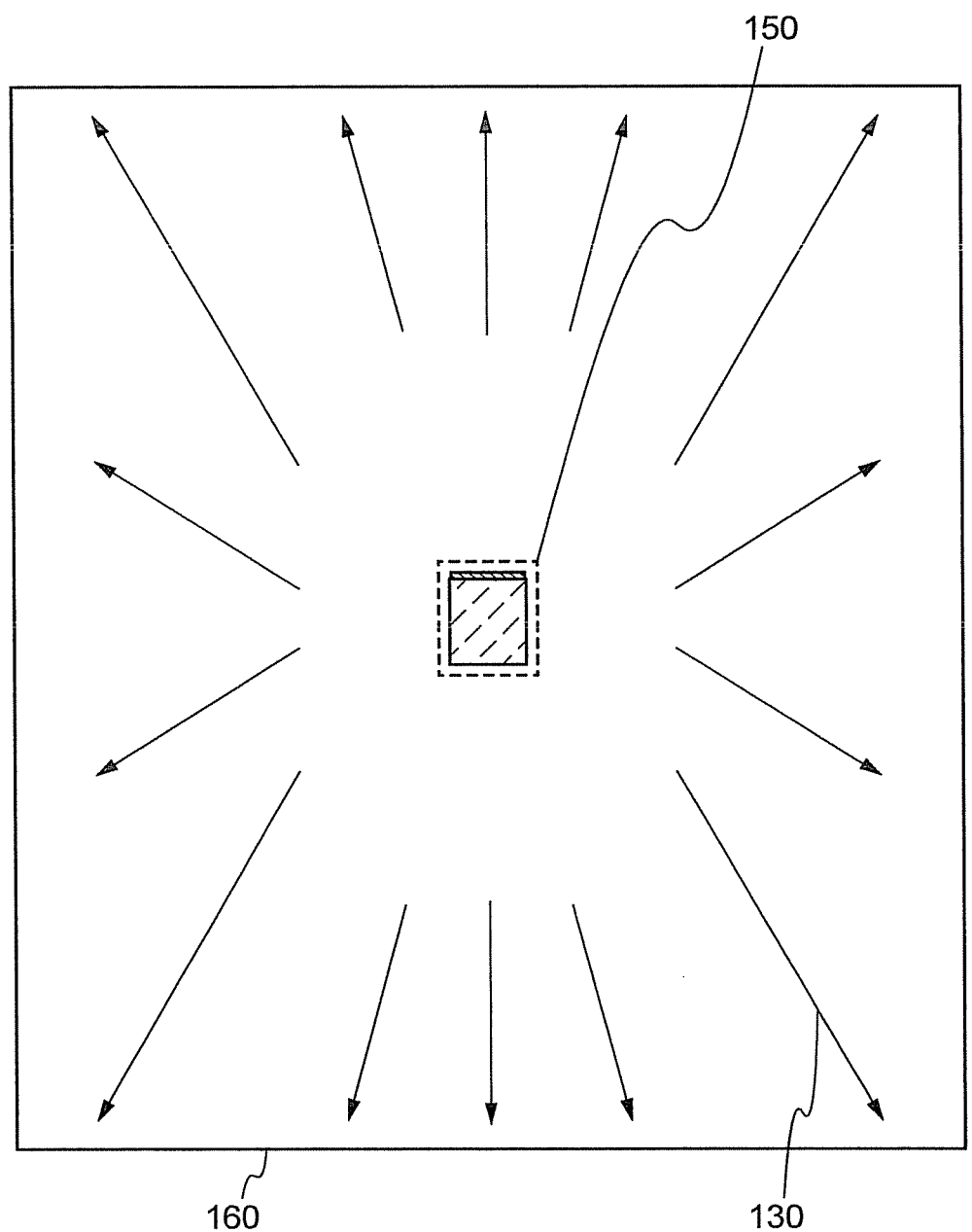
FIG. 4 illustrates a calculation model.

FIG. 4 is a schematic view of a model used for the calculation. The lighting device 150 is placed at the center of the calculation model. The lighting device 150 is placed so that the light-emitting element is positioned on the upper side and the light-transmitting base is positioned on the lower side. From the calculation, the state of the light beam 130 emitted from the lighting device 150 to a wall surface 160 surrounding the lighting device 150 is confirmed.

The respective states of light irradiation under conditions with different heights (h) of the base are illustrated in FIGS. 5A to 5I. In the vicinity of the center of each of the drawings, the lighting device is placed in a similar manner to that of FIG. 4. That is, the lighting device is placed in order that light from the light-emitting element is extracted to the lower side and the lateral side. In addition, in the drawings, a path of the light beam is denoted by a line segment.

Here, FIGS. 5A, 5B, 5C, 5D, 5E, 5F, 5G, 5H, and 5I illustrate the cases where the heights (h) of the base are 0.7 mm, 2 mm, 10 mm, 30 mm, 50 mm, 70 mm, 80 mm, 84 mm, and 90 mm, respectively.

From FIGS. 5A to 5I, it is found that light is emitted to the upper side of the light-emitting element (i.e., in a direction opposite to the light-transmitting base) in the case where the height of the base is small. In this case, it is necessary that the height of the base is 84 mm or higher in order that all the light from the light-emitting element is emitted to the lower side and the lateral side (i.e., to a direction of the light-transmitting base).

Next, a state of light irradiation in the case where a square planar light source (Lambert light source) with a size of 200 mm×200 mm is used as a light source, and the light-transmitting base which has a square pole shape with a size of 200 mm×200 mm×h mm is used is illustrated in FIGS. 6A to 6C. Note that the other conditions are the same as those of FIGS. 5A to 5I. Here, FIGS. 6A, 6B, and 6C illustrate the cases where the heights (h) of the base are 160 mm, 168 mm, and 170 mm, respectively.

From FIGS. 6A to 6C, it is found that all the light is emitted to the lower side and the lateral side (i.e., to the direction of the light-transmitting base) when the height of the base is 168 mm or larger in the case where the size of the planar light source is 200 mm×200 mm.

Next, a state of light irradiation in the case where a rectangular planar light source (Lambert light source) with a size of 100 mm×200 mm is used as a light source and the light-transmitting base which has a square pole shape with a size of 100 mm×200 mm×h mm is used is illustrated in FIGS. 7A to 7C. Note that in FIGS. 7A to 7C, the total amount of the light beam is 100 times as that of FIG. 5A to 5I and that of FIG. 6A to 6C and the other conditions are the same as those of FIG. 5A to 5I and 6A to 6C. Here, FIGS. 7A, 7B, and 7C illustrate the cases where the heights (h) of the base are 160 mm, 168 mm, and 170 mm, respectively.

From FIGS. 7A to 7C, it is found that all the light is emitted to the lower side and the lateral side (i.e., to the direction of the light-transmitting base) when the height of the base is 168 mm or higher in the case where the size of the planar light source is 100 mm×200 mm.

From the FIGS. 5A to 5I, FIGS. 6A to 6C, and FIGS. 7A to 7C, it can be said that in the case where the emission wavelength is 550 nm, the light-transmitting base has a square pole shape, and BK7 manufactured by Schott Inc. is used for the material of the light-transmitting base, when the following formula as for the relation between the height (h) of the base (see FIG. 1A) and the length ($l_1$) of a long side of the bottom surface of the base (or the planar light source) (see FIG. 3C) is satisfied, all the light from the light-emitting element is emitted to the lower side and the lateral side (i.e., to the direction of the light-transmitting base), so that all the light can be effectively used.

$$h \geq 0.84 \cdot l_1$$

<Relation Between Emission Wavelength and Height of Base>

Next, the state of light irradiation in the cases of the emission wavelengths of 400 nm and 800 nm was confirmed in order to confirm the relation between the emission wavelength and the height (h) of the base. Here, the above emission wavelengths were selected because 400 nm is a typical value of a shorter wavelength of the visible range and 800 nm is a typical value of a longer wavelength of the visible range. Note that the conditions other than the emission wavelength and the amount of light beam (100 times as that of FIGS. 5A to 5I) are the same as those of FIGS. 5A to 5I.

The state of light irradiation with the respective wavelengths are illustrated in FIGS. 8A to 8D. FIGS. 8A, 8B, 8C, and 8D illustrate the cases where the emission wavelengths and the heights (h) of the base are: 400 nm and 80 mm, 400 nm and 81 mm, 800 nm and 83 mm, and 800 nm and 84 mm, respectively.

From FIGS. 8A to 8D, it is found that in order to effective use all the light from the light-emitting element, the height (h) of the base needs to be 81 mm or higher in the case of the emission wavelength of 400 nm, and the height (h) of the base needs to be 84 mm in the case of the emission wavelength of 800 nm. In other words, it is understood that the lower limit ($h_{Low}$) of the height of the base tends to be higher on the long wavelength side. In a lighting device for general use such as a white emission light (other than a lighting device with a peculiar emission wavelength, such as an infrared light source), the value at the wavelength of 800 nm can represent the lower limit ($h_{Low}$) of the height of the base.

When the above description is taken into the consideration, it can be said that in the case where the light-transmitting base has a square pole shape and BK7 manufactured by Schott Inc. is used for the material of the light-transmitting base, when the following formula as for the relation between the height (h) of the base and the length ($l_1$) of the long side of the bottom surface of the base (or the planar light source) is satisfied, all the light from the light-emitting element is emitted to the lower side and the lateral side (i.e., to the direction of the light-transmitting base), so that all the light can be effectively used.

$$h \geq 0.84 \cdot l_1$$

<Relation Between Refractive Index of Base and Height of Base>

Next, in order to confirm relation between the refractive index (n) of the base and the height (h) of the base, the material of the light-transmitting base is changed and the state of light irradiation is confirmed. Here, an emission wavelength of 800 nm is selected, and PK51 manufactured by Schott Inc. (the refractive index is 1.52 at an emission wavelength of 800 nm), BAK4 manufactured by Schott Inc. (the refractive index is 1.56 at an emission wavelength of 800 nm), and polycarbonate (the refractive index is 1.57 at an emission wavelength of 800 nm) are selected for the material of the light-transmitting base. Note that the conditions other than the emission wavelength, the material of the base (refractive index), and the amount of light beam (100 times as that of FIGS. 5A to 5I) are the same as those of FIGS. 5A to 5I.

Figure 9:
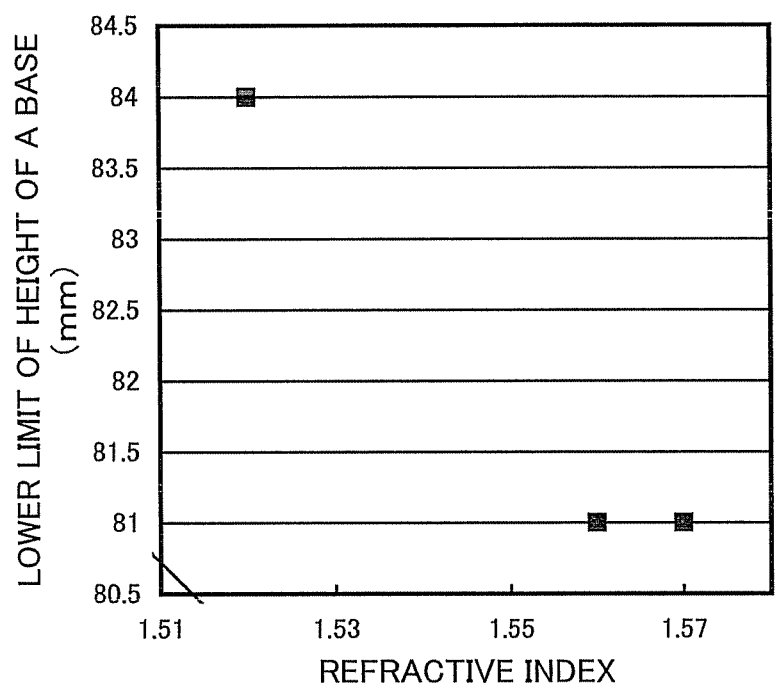
FIG. 9 shows relation between a lower limit ($h_{Low}$) of the height of a base and a refractive index (n) of the base.

FIG. 9 shows the relation between the refractive index (n) of the base and the lower limit ($h_{Low}$) of the height of the base, which is derived from the above results, for the purpose of effective use of all the light from the light-emitting element. In FIG. 9, the horizontal axis represents the refractive index (n) and the vertical axis represents the lower limit ($h_{Low}$) of the height of the base. In addition, a straight line in FIG. 9 links the result of the PK51 (the refractive index: 1.52) and the result of the BAK4 (the refractive index: 1.56). Although the results of the polycarbonate (the refractive index: 1.57) slightly deviates from the straight line, the straight line is regarded as the lower limit ($h_{Low}$) of the height of the base.

Accordingly, it is understood that generally, the relation between the refractive index (n) and the lower limit ($h_{Low}$) of the height of the base is as follows:

$$h_{Low} = -75 \cdot n + 198 \text{(mm)}$$

Considering that $h_{Low}$ is the lower limit of the height (h) in the case where the long side of the planar light source is 100 mm, the lower limit ($h_{Low, 1}$) of the height (h) of the base in the case where the long side of the bottom surface of the base (or the planar light source) is 1 mm is in the following relation:

$$-75 \cdot n + 198 : 100 = h_{Low, 1} : l, \text{ that is,}$$

$$h_{Low, 1} = (-0.75 \cdot n + 1.98) \cdot l$$

Accordingly, in the case of the light-transmitting base having a square pole shape, when the following formula as for the height (h) of the base is satisfied, all the light from the light-emitting element is emitted to the lower side and the lateral side (i.e., to the direction of the light-transmitting base), so that all the light can be effectively used.

$$h \geq (-0.75 \cdot n + 1.98) \cdot l$$

<Relation Between Shape of Bottom Surface of Base (Planar Light Source) and Height of Base>

Next, in order to confirm relation between the shape of the bottom surface of the base (or the planar light source) and the height (h) of the base, the same calculation as that of <Relation between refractive index of base and height of base> is performed in the case of a cylindrical shape. Specifically, in <Relation between refractive index of base and height of base>, the shape of the planar light source is change to a round shape having a diameter of 100 mm and the shape of the light-transmitting base is change to a cylindrical shape with a bottom surface having a diameter of 100 mm and a height of h mm, and then a state of light irradiation is confirmed.

Figure 10:
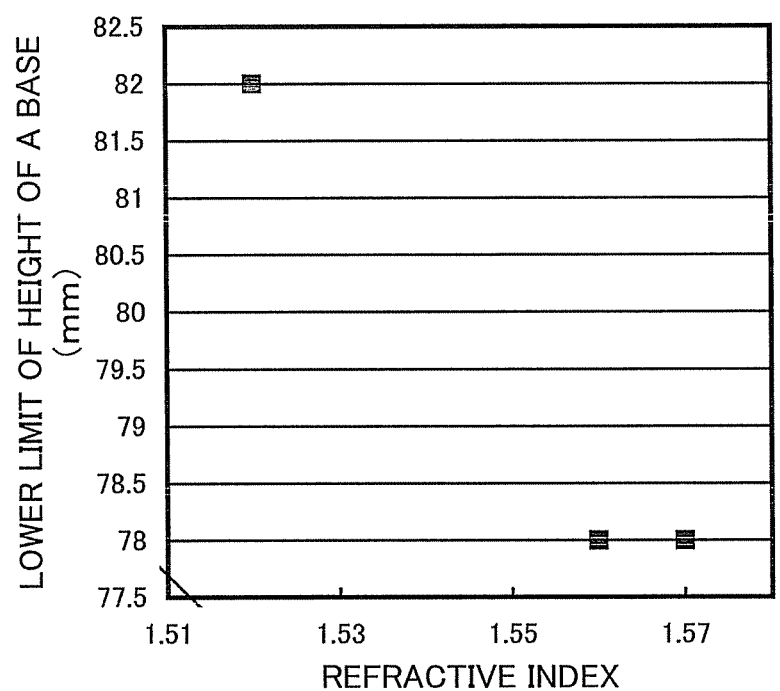
FIG. 10 shows relation between a lower limit ($h_{Low}$) of the height of a base and a refractive index (n) of the base.

FIG. 10 shows the relation between the refractive index (n) of the base and the lower limit ($h_{Low}$) of the height of the base, which is derived from the above results, for the purpose of effective use of all the light from the light-emitting element. In FIG. 10, the horizontal axis represents the refractive index (n) and the vertical axis represents the lower limit ($h_{Low}$) of the height of the base. In addition, a straight line in FIG. 10 links the result of the PK51 (the refractive index: 1.52) and the result of the BAK4 (the refractive index: 1.56). Although the result of the polycarbonate (the refractive index: 1.57) slightly deviates from the straight line, in a similar manner to the case of FIG. 9, the straight line is regarded as the lower limit ($h_{Low}$) of the height of the base.

Accordingly, it is understood that generally, the relation between the refractive index (n) and the lower limit ($h_{Low}$) of the height of the base is as follows:

$$h_{Low} = -100 \cdot n + 234 \text{(mm)}$$

Accordingly, in the case of the light-transmitting base having a cylindrical shape, when the following formula as for the height (h) of the base is satisfied, all the light from the light-emitting element is emitted to the lower side and the lateral side (i.e., to the direction of the light-transmitting base), so that all the light can be effectively used.

$$h \geq (-n + 2.34) \cdot l$$

Note that in the above formula, 1 mm is the diameter of the bottom surface of the base (or the planar light source).

Note that in the case of a general material, the above conditions are more lenient than the conditions described in <Relation between refractive index of base and height of base>. Therefore, in the case where the light-transmitting base has a cylindrical shape, the lower limit of the height (h) can be estimated with reference to the conditions described in <Relation between the refractive index of the base and the height of the base>. Specifically, for example, a square pole shape whose bottom surface is a square circumscribing the bottom surface can be used as a reference for estimation. In other words, in the case of the length (l) of one side of the square circumscribing the bottom surface, when the following formula as for the height (h) of the base is satisfied, all the light from the light-emitting element is emitted to the lower side and the lateral side (i.e., to the direction of the light-transmitting base), so that all the light can be effectively used.

$$h \geq (-0.75 \cdot n + 1.98) \cdot l$$

Figure 11A:
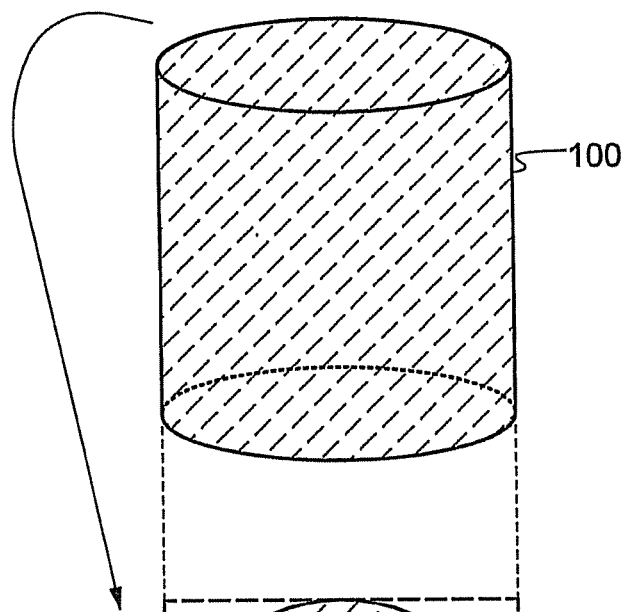
FIGS. 11A to 11C illustrate a shape of a bottom surface of a base.
Figure 11B:
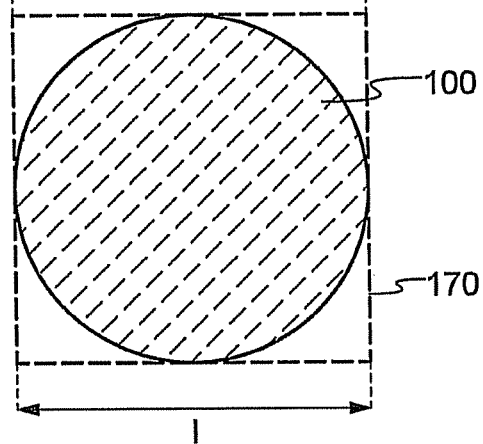

FIGS. 11A and 11B schematically illustrate the case where the base 100 has a cylindrical shape. As illustrated in FIG. 11B, assuming that existence of a square 170 tangent to the bottom surface of the base 100 from the outside, the length (l) of one side of the square 170 can be used as a reference for estimation.

The same applies to the case where the base has a prismatic shape with a bottom surface which is a polygon having m angles ($4 \leq m \leq \infty$). This is because as the number of m is increased, the shape of the base becomes closer to a cylindrical shape and therefore, the lower limit of the height (h) has an intermediate value between the lower limit of the height (h) in the case of a square pole shape and that in the case of a cylindrical shape.

The summary of the above is as follows. In the case where the light-transmitting base has a prismatic shape with a bottom surface having m angles ($4 \leq m \leq \infty$), when the following formula as for relation of the height (h), the refractive index (n) of the material of the base, and the length (l) of one surface of a square circumscribing the bottom surface (tangent to the bottom surface from the outside) is satisfied, all the light from the light-emitting element is emitted to the lower side and the lateral side (i.e., to the direction of the light-transmitting base), so that all the light can be effectively used.

$$h \geq (-0.75 \cdot n + 1.98) \cdot l$$

Here, "m=∞" means to the case where the shape of the light-transmitting base has a cylindrical shape. In addition, although there may be a plurality of squares circumscribing the bottom surface having m angles in the case where m is finite, when the length (l) of one side is calculated, any of the squares can be used as a reference.

Figure 11C:
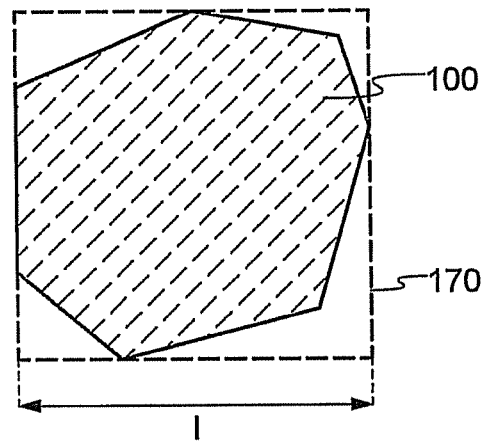

For example, in the case where the base 100 has a prismatic shape with a heptangular bottom surface, as illustrated in FIG. 11C, assuming existence of the square 170 (preferably a square having the minimum area) tangent to the heptangular bottom surface, the length (l) of one side of the square 170 can be used as a reference for estimation.

When the base with which the above conditions are satisfied is used, all the light can be effectively used. Accordingly, a lighting device in which an irradiation range is secured and light extraction efficiency is improved can be obtained.

Embodiment 3

Figure 12:
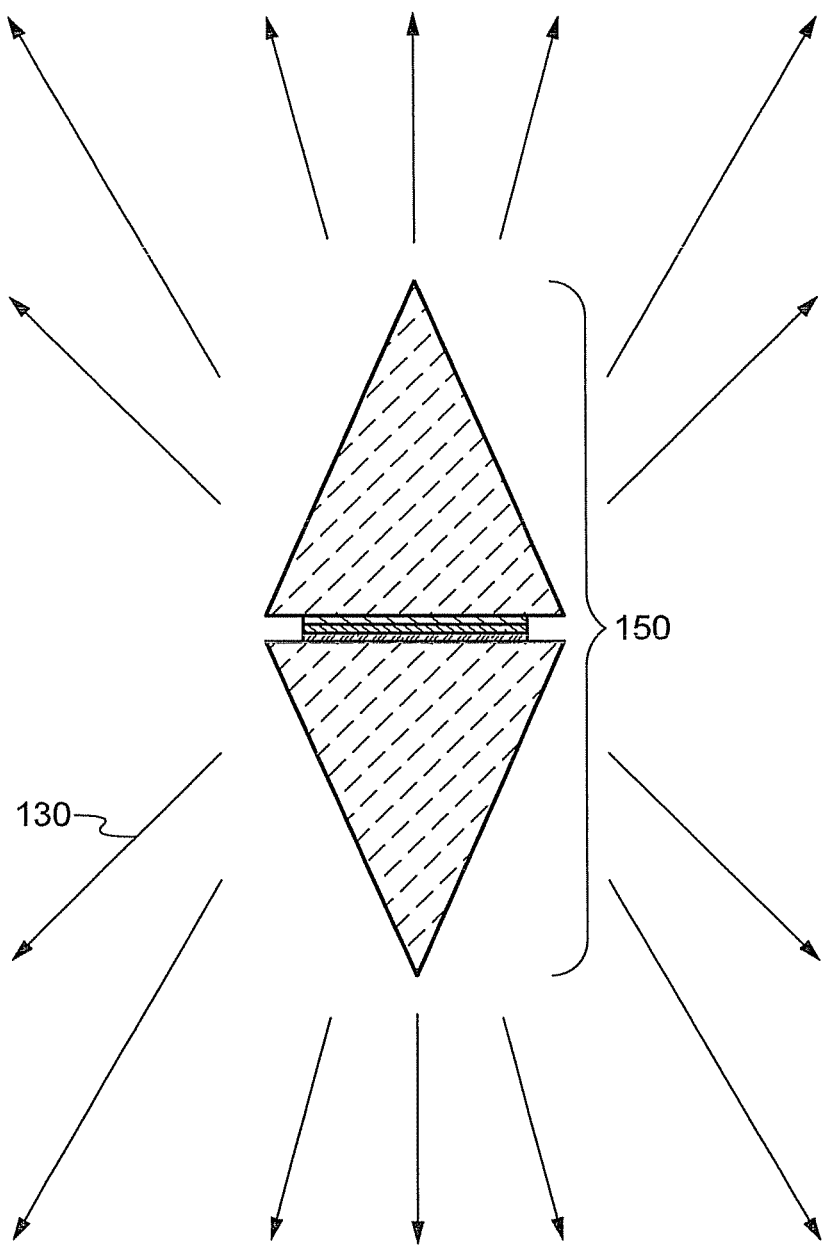
FIG. 12 illustrates an example of a lighting device.

In this embodiment, a modified example of a lighting device which is an embodiment of the disclosed invention is described using FIG. 12.

FIG. 12 illustrates a lighting device in which another light-transmitting base having the same shape as the light-transmitting base is provided above the second electrode of the lighting device described in the aforementioned embodiment (on a side opposite to the light transmitting base).

With such a structure, a lighting device which can emit light from a light-emitting element to all directions can be obtained. In the lighting device described in this embodiment, a dual-emission-type light-emitting element is used.

Note that the structure described this embodiment can be combined as appropriate with any structure described in the other embodiments.

Embodiment 4

Figure 13:
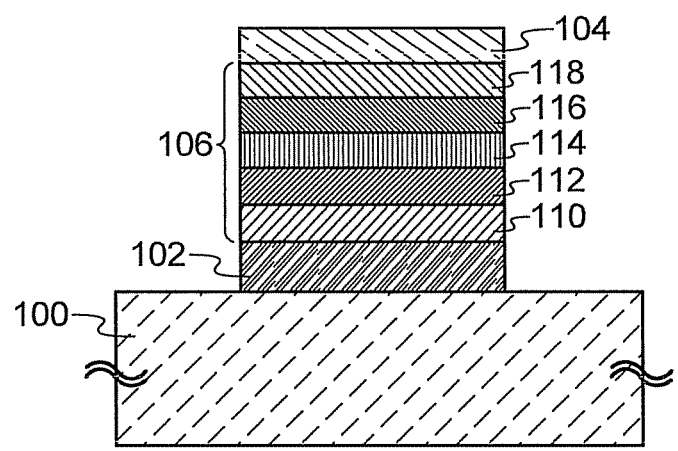
FIG. 13 illustrates an example of a light-emitting element.

In this embodiment, details of a lighting device and a light-emitting element used for the lighting device are described using FIG. 13. Note that although an organic EL element formed mainly using an organic material is used as the light-emitting element as an example, an inorganic EL element formed using an inorganic material can also be used.

<Base>

A light-transmitting base 100 functions as a support of the light-emitting element. The light-transmitting base 100 can be formed using, for example, an insulating material such as glass or plastic. Note that a base formed using a material other than the above material may be used as long as the light-transmitting property of the base is secured.

Although the shape of the light-transmitting base 100 is as described in the above embodiment, processing for making the light-transmitting base 100 to have the shape can be performed either before formation of the light-emitting element or after formation of the light-emitting element. Needless to say, the base may be processed to have a desired shape at a stage of formation of the base.

<First Electrode>

A first electrode 102 functions as an anode and as a light-extraction electrode. It is preferable that a material having a large work function be used for the first electrode 102 used as an anode. Specifically, conductive oxide such as indium tin oxide (ITO), indium tin oxide containing silicon oxide (ITSO), and indium oxide containing zinc oxide (IZO) at 2 wt % to 20 wt % can be used.

Note that the above conductive oxide is usually formed by a sputtering method, but may also be formed by an inkjet method, a spin coating method, or the like by application of sol-gel method or the like. When a sputtering method is used, for example, indium oxide and zinc oxide (IZO) can be formed using indium oxide to which zinc oxide is added at 1 to 20 wt % as a target. Indium oxide containing tungsten oxide and zinc oxide can be formed by sputtering using a target in which tungsten oxide and zinc oxide are added to indium oxide at 0.5 wt % to 5 wt % and 0.1 wt % to 1 wt %, respectively.

In addition, a material such as gold (Au), platinum (Pt), nickel (Ni), tungsten (W), chromium (Cr), molybdenum (Mo), iron (Fe), cobalt (Co), copper (Cu), or palladium (Pd) may be used. In this case, in order to secure a predetermined transmittance, it is preferable that the first electrode 102 be thinly formed.

Note that in order to effectively extract light generated in an EL layer to the outside, it is preferable that transmittance of the first electrode 102 at a visible light range (a wavelength range of greater than or equal to 400 nm and less than or equal to 800 nm) be 70% or more.

<EL Layer>

An EL layer 106 includes at least a light-emitting layer 114. In the light-emitting element described in this embodiment, the EL layer 106 includes a layer 110 including a composite material, a hole-transport layer 112, the light-emitting layer 114, an electron-transport layer 116, and an electron-injection layer 118; however, the structures other than the light-emitting layer 114 are optional. In other words, the EL layer 106 can be formed with an appropriate combination of a layer including a substance having a high electron-transport property, a substance having a high hole-transport property, a substance having a high electron-injection property, a substance having a high hole-injection property, a bipolar substance (a substance having a high electron-transport property and a high hole-transport property), or the like; a light-emitting layer; a layer including a composite material, and the like.

Any of various methods can be employed for forming the EL layer 106 regardless of whether it is a dry process or a wet process. For example, a vacuum evaporation method, an inkjet method, a spin coating method, or the like can be used. As described above, the EL layer 106 is formed with a stacked structure of the layer including a composite material, the hole-transport layer, the light-emitting layer, the electron-transport layer, the electron-injection layer (a buffer layer), and the like, and these layers are formed using a common deposition method, so that simplification of a process or the like can be performed. Details of these layers are described below.

<EL Layer—Layer Including Composite Material>

The layer 110 including a composite material is a layer including a composite material in which an acceptor substance is added to a substance having a high hole-transport property. By using such a composite material, an excellent hole-injection property from the first electrode 102 can be obtained. The layer 110 including a composite material can be formed by co-evaporation of a substance having a high hole-transport property and an acceptor substance, for example.

Although there is no particular limitation on the substance having a high hole-transport property as long as the substance having a high hole-transport property has a hole-transport property higher than an electron-transport property, a substance having hole mobility of $10^{-6}$ cm$^2$/Vs or higher is more preferable.

As examples of the organic compound having a high hole-transport property, for example, the following aromatic amine compounds can be given: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), and the like.

In addition, the following carbazole derivatives can be given as examples: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Furthermore, the following aromatic hydrocarbon compounds can be given as examples: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracen, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Furthermore, the following high molecular compounds (oligomers, dendrimers, polymers, and the like) are given as examples: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), and the like.

As examples of the acceptor substance, organic compounds such as 7,7,8,8-tetracyano-2,3,5,6-tetrafluoroquinodimethane (abbrev.: F$_4$-TCNQ) and chloranil and a transition metal oxide can be given. In particular, an oxide of a metal belonging to any of Group 4 to Group 8 in the periodic table is preferably used. Specifically, vanadium oxide, niobium oxide, tantalum oxide, chromium oxide, molybdenum oxide, tungsten oxide, manganese oxide, and rhenium oxide having high electron-accepting properties, and the like are preferable. Among them, molybdenum oxide is particularly preferable because it is stable in the atmosphere, low in hygroscopicity, and is easy to be handled.

<EL Layer—Hole-Transport Layer>

The hole-transport layer 112 is a layer that contains a substance having a high hole-transport property. Although there is no particular limitation on the substance having a high hole-transport property as long as the substance having a high hole-transport property has a hole-transport property higher than an electron-transport property, a substance having hole mobility of $10^{-6}$ cm$^2$/Vs or higher is more preferable.

As the substance having a high hole-transport property, the following aromatic amine compounds are given as examples: NPB, TPD, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB), and the like.

Furtherer, high molecular compounds such as PVK, PVTPA, PTPDMA, and Poly-TPD are given.

Alternatively, a composite material in which an acceptor substance is contained in the substance having a high hole-transport property can be used.

Alternatively, the hole-transport property may be adjusted by adding an organic compound having a hole-trapping property, a substance having a high electron-transport property, or a hole-blocking material to the hole-transport layer 112. The organic compound having a hole-trapping property preferably has an ionization potential lower than a substance having a high hole-transport property which is included in the hole-transport layer 112 by 0.3 eV or higher. In addition, as the substance having a high electron-transport property, the later-given substance that can be used for the electron-transport layer 116 or the like can be used. Further, for the hole-blocking material, a material having an ionization potential of 5.8 eV or higher, or a material having an ionization potential higher than a substance having a high hole-transport property which is included in the hole-transport layer by 0.5 eV or higher is preferably used. Note that the organic compound having a hole-trapping property or the substance having a high electron-transport property which is added may emit light the color of which is preferably similar to emission light of the light-emitting layer 114 in view of keeping of excellent color purity.

Note that the hole-transport layer 112 is not limited to a single layer and may have a stacked structure of two or more layers.

<EL Layer—Light-Emitting Layer>

The light-emitting layer 114 is a layer containing a substance having a high light-emitting property, and can be formed using various materials. As the substance having a high light-emitting property, a fluorescent compound which emits fluorescence or a phosphorescent compound which emits phosphorescence can be used, for example. Since a phosphorescent compound which emits phosphorescence has a high light-emitting property, in the case where it is used for the light-emitting layer 114, an advantage of lower power consumption and the like can be obtained.

As examples of the phosphorescent compound, the following materials for blue light emission are given: bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis[2-(3',5'bistrifluoromethylphenyl)pyridinato-N,C$^{2'}$]iridium(III) picolinate (abbreviation:

Ir(CF₃ppy)₂(pic)), bis[2-(4',6'-difluorophenyl)pyridinato-N,C²']iridium(III) acetylacetonate (abbreviation: FIr(acac)), and the like.

As examples of a material for green light emission, tris(2-phenylpyridinato-N,C²')iridium(III) (abbreviation: Ir(ppy)₃), bis[2-phenylpyridinato-N,C²']iridium(III)acetylacetonate (abbreviation: Ir(ppy)₂(acac)), bis(1,2-diphenyl-1H-benzimidazolato)iridium(III)acetylacetonate (abbreviation: Ir(pbi)₂(acac)), bis(benzo[h]quinolinato)iridium(III)acetylacetonate (abbreviation: Ir(bzq)₂(acac)), and the like are given. As examples of a material for yellow light emission, bis(2,4-diphenyl-1,3-oxazolato-N,C²')iridium(III)acetylacetonate (abbreviation: Ir(dpo)₂(acac)), bis[2-(4'-perfluorophenylphenyl)pyridinato]iridium(III)acetylacetonate (abbreviation: Ir(p-PF-ph)₂(acac)), bis(2-phenylbenzothiazolato-N, C²')iridium(III)acetylacetonate (abbreviation: Ir(bt)₂(acac)), and the like are given.

As a material for orange light emission, tris(2-phenylquinolinato-N,C²')iridium(III) (abbreviation: Ir(pq)₃), bis(2-phenylquinolinato-N,C²')iridium(III) acetylacetonate (abbreviation: Ir(pq)₂(acac)), and the like are given.

Further, as examples of a material for red light emission, the following organometallic complexes can be given: bis[2-(2'-benzo[4,5-α]thienyl)pyridinato-N,C³']iridium(III) acetylacetonate (abbreviation: Ir(btp)₂(acac)), bis(1-phenylisoquinolinato-N,C²')iridium(III) acetylacetonate (abbreviation: Ir(piq)₂(acac)), (acetylacetonato)bis[2,3-bis(4-fluorophenyl)quinoxalinato]iridium(III) (abbreviation: Ir(Fdpq)₂(acac)), and 2,3,7,8,12,13,17,18-octaethyl-21H,23H-porphyrin platinum(II) (abbreviation: PtOEP), and the like.

As examples of the fluorescent compound, the following materials for blue light emission can be given: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and the like As examples of a material for green light emission, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviated to 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracene-2-amine (abbreviation: 2YGABPhA), N,N,9-triphenylanthracen-9-amine (abbreviation: DPhAPhA), and the like are given.

As examples of a material for yellow light emission, rubrene; 5,12-bis(1,1'-biphenyl-4-yl)-6,11-diphenyltetracene (abbreviation: BPT) and the like are given.

Furthermore, as examples of a material for red light emission, N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), and the like are given.

Note that the light-emitting layer 114 may have a structure in which a substance having a high light-emitting property (guest material) is dispersed in another substance (host material). A light-emitting substance (host material) can be dispersed in various kinds of substances, and it is preferably dispersed in a substance that has a lowest unoccupied molecular orbital (LUMO) level higher than that of the light-emitting substance and has a highest occupied molecular orbital (HOMO) level lower than that of the light-emitting substance.

As examples of the substance in which the light-emitting substance is dispersed, the following can be given: a metal complex such as tris(8-quinolinolato)aluminum(III) (abbreviation: Alq), tris(4-methyl-8-quinolinolato)aluminum(III) (abbreviation: Almq₃), bis(10-hydroxybenzo[h]quinolinato)beryllium(II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: Zn(BTZ)₂); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-antluyl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

As the substance in which the light-emitting substance is dispersed, a plurality of kinds of substances may be used. For example, a substance which inhibits crystallization, such as rubrene, can be added to the substance in which the light-emitting substance is dispersed. In order to effectively perform energy transfer to the light-emitting substance, NPB or Alq may be added.

Thus, with a structure in which a substance having a high light-emitting property is dispersed in another substance, crystallization of the light-emitting layer 114 can be suppressed. Further, concentration quenching due to high concentration of the substance having a high light-emitting property can be suppressed.

Note that the light-emitting layer 114 is not limited to a single layer and may have a stacked structure of two or more layers.

<EL Layer—Electron Transport Layer>

The electron-transport layer 116 is a layer containing a substance having a high electron-transport property. Although there is no particular limitation on the substance having a high electron-transport property as long as an electron-transport property thereof is higher than a hole-transport property thereof, mainly, a substance having an electron mobility of $10^{-6}$ cm$^2$/Vs or higher is more preferable.

As examples of the substance having a high electron-transport property, the following metal complexes can be given: tris(8-quinolinolato)aluminum(III) (abbreviation: Alq), tris (4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), bis[2-(2-benzothiazolyl)phenolato]zinc(II) (abbreviation: ZnBTZ), and the like.

In addition, the following heterocyclic compound can be given as examples: 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), bathophenanthroline (abbreviation: BPhen), bathocuproine (abbreviation: BCP), and the like.

Further, the following high molecular compounds can also be given as examples: poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), and the like.

Further, by addition of an organic compound having an electron-trapping property or a substance having a high hole-transport property to the electron-transport layer 116, the electron-transport property may be controlled. As the organic compound having an electron-trapping property, an organic compound having an electron affinity larger than the substance having a high electron-transport property which is included in the electron-transport layer 116 by 0.30 eV or higher is preferably used. In addition, as the substance having a high hole-transport property, a substance which can be used for the hole-transport layer 112 or the like can be used. Note that the organic compound having an electron-trapping property and the substance having a high hole-transport property, which are added, may emit light the color of which is preferably similar to the emission color of the light-emitting layer 114 in view of keeping of excellent color purity.

Note that the electron-transport layer 116 is not limited to a single layer and may be have a stacked layer of two or more layers.

<EL Layer—Electron-Injection Layer>

The electron-injection layer 118 (also referred to as a buffer layer) is a layer including a substance having a high electron-injection property.

As examples of the substance having a high electron-injection property, the following alkali metals, alkaline earth metals, rare earth metals, and compounds thereof can be given: lithium (Li), cesium (Cs), magnesium (Mg), calcium (Ca), ytterbium (Yb), lithium fluoride (LiF), calcium fluoride (CaF$_2$), cesium fluoride (CsF), magnesium fluoride (MgF$_2$), lithium carbonate (Li$_2$CO$_3$), cesium carbonate (Cs$_2$CO$_3$), lithium oxide (Li$_2$O), erbium fluoride (ErF$_3$), lithium acetylacetonate, 8-quinolinolato-lithium, and the like. In particular, it is preferable to use a lithium compound such as lithium fluoride (LiF), lithium oxide (Li$_2$O), lithium carbonate (Li$_2$CO$_3$), lithium acetylacetonate, or 8-quinolinolato-lithium because of their excellent electron-injection properties.

Further, the electron-injection layer 118 may include a material of a substance having an electron-transport property to which a donor substance is added. As the donor substance, an alkali metal, an alkaline earth metal, a rare earth metal, or a compound thereof is given. For example, a material of Alq to which magnesium (Mg) is added, a material of Alq to which lithium (Li) is added, or the like can be used.

Note that the electron-injection layer 118 is not limited to a single layer and may have a stacked structure of two or more layers.

<Second Electrode>

The second electrode 104 functions as a cathode and as a light-reflective electrode. The second electrode 104 serving as a cathode is formed using a substance having a small work function. Specifically, it is possible to use aluminum (Al), indium (In), an alkali metal such as lithium (Li) or cesium (Cs), an alkaline-earth metal such as magnesium (Mg) or calcium (Ca), a rare-earth metal such as erbium (Er) or ytterbium (Yb), or the like. The electrode can also be formed from an alloy such as aluminum-lithium alloy (AlLi) or magnesium-silver alloy (MgAg). The second electrode 104 can be formed using a vacuum evaporation method, a sputtering method, or the like.

Note that in the case where a dual-emission type light-emitting element is needed as the lighting device illustrated in FIG. 12, the second electrode 104 is formed so as to have a light-transmitting property. For example, a stacked structure of a conductive layer formed using the above material and conductive oxide used for the first electrode 102 can be employed.

In the case where a dual-emission-type light-emitting element is formed, it is preferable that the transmittance of the second electrode 104 at a visible light range (a wavelength range of greater than or equal to 400 nm and less than or equal to 800 nm) be 70% or more.

In addition, in the case where a dual-emission-type light-emitting element is formed, a stacked structure in which the second electrode 104, the electron-injection layer 118, the electron-transport layer 116, the light-emitting layer 114, the hole-transport layer 112, the layer 110 including a composite material, and the first electrode 102 are provided in this order from the base side may be employed.

Note that the structure of this embodiment can be combined as appropriate with any of structures described in the other embodiments.

Embodiment 5

In this embodiment, an example of a light-emitting element in which a plurality of light-emitting units are stacked (hereinafter this light-emitting element is referred to as a stacked-type light-emitting element) will be described with reference to FIG. 14.

Figure 14:
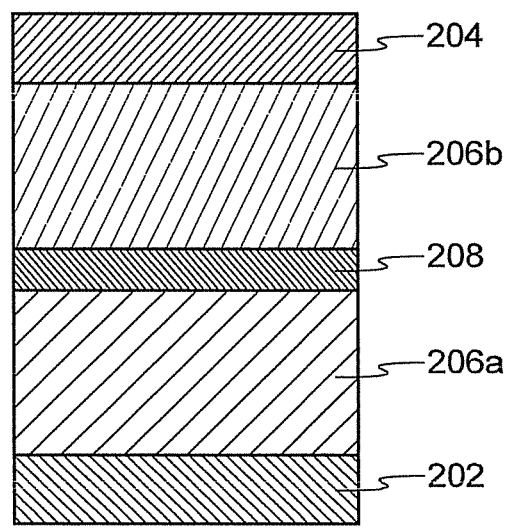
FIG. 14 illustrates an example of a light-emitting element.

A light-emitting element illustrated in FIG. 14 includes a first electrode 202, a second electrode 204, a first EL layer 206a and a second EL layer 206b between the first electrode 202 and the second electrode 204, and a charge generation layer 208 between the first EL layer 206a and the second EL layer 206b. Here, the structures of the first electrode 202 and the second electrode 204 are the same as those of the first electrode 202 and the second electrode 204 of Embodiment 1. In addition, each of the structures of the EL layer 206a and the EL layer 206b is the same as the structure of the EL layer 106 described in the above embodiments. Note that the EL layer 206a and the EL layer 206b may have either the same structure or different structures.

The charge generation layer 208 has a function of injecting electrons into one of the EL layers and injecting holes into the other of the EL layers when voltage is applied between the first electrode 202 and the second electrode 204. Note that the charge generation layer 208 may have a single-layer structure or a stacked structure. In the case of a stacked structure, for example, a structure in which a layer having a function of injecting electrons and a layer having a function of injecting holes are stacked can be employed. In addition, a layer included in the EL layer may be combined with the charge generation layer 208.

As the layer that injects electrons, a layer formed from a semiconductor or an insulator, such as lithium oxide, lithium fluoride, or cesium carbonate, can be used. Alternatively, a layer formed from a material of a substance having a high electron-transport property to which a donor substance is added can be used. As the donor substance, an alkali metal, an alkaline-earth metal, a rare earth metal, a metal belonging to Group 13 of the periodic table, an oxide or carbonate of any of these, or the like can be used. For example, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the donor substance. As the substance having a high electron-transport property, the materials described in the above embodiment can be used. In addition, as the substance having a high electron-transport property, a substance having an electron mobility of $10^{-6}$ cm$^2$/Vs or higher is preferably used, although other substances may also be used as long as the electron-transport property thereof is higher than the hole-transport property thereof. The composite material including the substance having a high electron-transport property and the donor substance is excellent in a carrier-injection property and a carrier-transport property, and therefore, by using the composite material, low-voltage driving and low-current driving can be realized.

As the hole-injection layer, a layer formed from a semiconductor or an insulator, such as molybdenum oxide, vanadium oxide, rhenium oxide, or ruthenium oxide, can be used. Alternatively, a layer formed from a material of a substance having a high hole-transport property to which an acceptor substance is added may be used. The layer including a substance having a high hole-transport property and an acceptor substance is formed using the composite material described in the above embodiment and includes, as the acceptor substance, 7,7,8,8-tetracyano-2,3,5,6-tetrafluoroquinodimethane (abbreviation: F$_4$-TCNQ) or metal oxide such as vanadium oxide, molybdenum oxide, or tungsten oxide. As the substance having a high hole-transport property, various compounds such as an aromatic amine compound, a carbazole derivative, aromatic hydrocarbon, and a high-molecular compound (such as an oligomer, a dendrimer, or a polymer) can be used. In addition, although a substance having an hole mobility of $10^{-6}$ cm$^2$/Vs or higher is preferably used for the substance having a high hole-transport property, other substances may also be used as long as the hole-transport property thereof is higher than the electron-transport property thereof. The composite material including the substance having a high hole-transport property and the acceptor substance is excellent in a carrier-injection property and a carrier-transport property, and therefore, by using the composite material, low-voltage driving and low-current driving can be realized.

Further, electrode materials described in the above embodiment can also be used for the charge generation layer 208. For example, the charge generation layer 208 may be formed by combining a layer including a substance having a high hole-transport property and metal oxide with a transparent conductive film. Note that in view of light extraction efficiency, the charge generation layer 208 is preferably formed using a light-transmitting material.

Although the light-emitting element having the two EL layers is described in this embodiment, a light-emitting element having three or more EL layers can be employed. In that case, it is preferable that a plurality of EL layers be connected to each other with a charge generation layer therebetween. By providing a charge generation layer between EL layers, luminance can be improved while low current density is kept, and the lifetime of the element can be prolonged.

Further, by forming the EL layers to emit light of different colors from each other, an emission color that is provided by the light-emitting element as a whole can be controlled. For example, in the light-emitting element having two EL layers, when an emission color of the first EL layer and an emission color of the second EL layer are made to be complementary colors, it is possible to obtain a light-emitting element from which white light is emitted from the whole light-emitting element. Here, the complementary colors refer to colors that can produce an achromatic color when they are mixed. Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any structure described in the other embodiments.

Embodiment 6

In this embodiment, an example of application of the lighting device described in the above embodiment is described.

Figure 15:
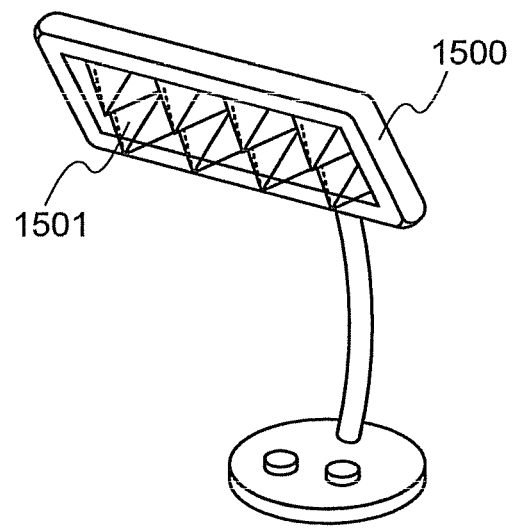
FIG. 15 illustrates an example of a lighting device.

In FIG. 15, a desk lamp is illustrated as an example of application of the lighting device described in the above embodiment. The desk lamp of FIG. 15 includes a housing 1500 and a light source 1501. The lighting device described in the above embodiment is used as the light source 1501 in the desk lamp. According to an embodiment of the disclosed invention, the desk lamp with excellent characteristics can be provided at low cost.

Figure 16:
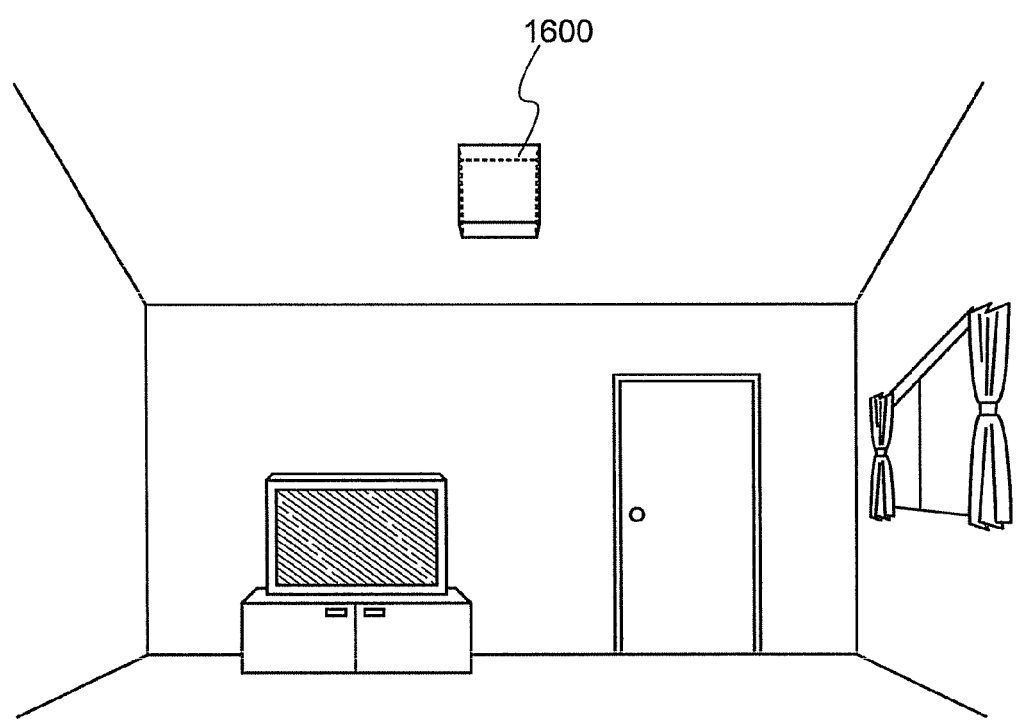
FIG. 16 illustrates an example of a lighting device.

In FIG. 16, an indoor lighting device 1600 is illustrated as an example of application of the lighting device described in the above embodiment. The lighting device relating to an embodiment of the disclosed invention has a sufficient irradiation range and therefore, is suitable for an indoor lighting device. According to an embodiment of the disclosed invention, the lighting device with excellent characteristics can be provided at low cost.

Note that the structure described in this embodiment can be combined as appropriate with any structure described in the other embodiments.

This application is based on Japanese Patent Application serial no. 2009-215436 filed with Japan Patent Office on Sep. 17, 2009, the entire contents of which are hereby incorporated by reference.

What is claimed is:

1. A lighting device comprising:
   a light-transmitting base;
   a first light-transmitting electrode over a surface of the light-transmitting base;
   an EL layer over the first light-transmitting electrode; and
   a second electrode over the EL layer,
   wherein the light-transmitting base has a cylindrical shape,
   wherein a thickness of the light-transmitting base over a length of a diameter of a bottom surface of the light-transmitting base is represented by the following formula:

$h \geq (-n+2.34) \times l,$ wherein h is the thickness of the light-transmitting base,
wherein n is a refractive index of the light-transmitting base, and
wherein l is the length of the diameter of the bottom surface of the light-transmitting base, and
wherein l is 10 mm or more.

2. The lighting device according to claim 1, wherein the light-transmitting base includes a glass or a plastic.

3. The lighting device according to claim 1, wherein the EL layer comprises a plurality of light-emitting units which are stacked.

4. The lighting device according to claim 1, wherein the second electrode is a second light-transmitting electrode.

5. The lighting device according to claim 1, wherein the EL layer includes a transition metal oxide.

6. A lighting device comprising:
a light-transmitting substrate;
a first light-transmitting electrode over a first surface of the light-transmitting substrate;
an EL layer over the first light-transmitting electrode;
a second electrode over the EL layer; and
a light-transmitting base attached to a second surface of the light-transmitting substrate which is opposite to the first surface of the light-transmitting substrate,
wherein the light-transmitting base has a cylindrical shape,
wherein a thickness of the light-transmitting base over a length of a diameter of a bottom surface of the light-transmitting base is represented by the following formula:

$h \geq (-n+2.34) \times l,$ wherein h is the thickness of the light-transmitting base,
wherein n is a refractive index of the light-transmitting base, and
wherein l is the length of the diameter of the bottom surface of the light-transmitting base, and
wherein l is 10 mm or more.

7. The lighting device according to claim 6, wherein the light-transmitting substrate includes a glass or a plastic.

8. The lighting device according to claim 6, wherein the EL layer comprises a plurality of light-emitting units which are stacked.

9. The lighting device according to claim 6, wherein the second electrode is a second light-transmitting electrode.

10. The lighting device according to claim 6, wherein the EL layer includes a transition metal oxide.

* * * * *